(12) United States Patent
Chen et al.

(10) Patent No.: US 9,397,090 B1
(45) Date of Patent: Jul. 19, 2016

(54) SEMICONDUCTOR DEVICE

(71) Applicant: Macronix International Co., Ltd., Hsinchu (TW)

(72) Inventors: Hsin-Liang Chen, Hsinchu (TW); Ying-Chieh Tsai, Chiayi (TW); Wing-Chor Chan, Hsinchu (TW); Shyi-Yuan Wu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/683,673

(22) Filed: Apr. 10, 2015

(51) Int. Cl.
*H01L 21/70* (2006.01)
*H01L 27/06* (2006.01)
*H01L 29/78* (2006.01)
*H01L 29/73* (2006.01)
*H01L 29/10* (2006.01)
*H01L 29/08* (2006.01)
*H01L 27/092* (2006.01)
*H01L 27/02* (2006.01)

(52) U.S. Cl.
CPC ........ *H01L 27/0623* (2013.01); *H01L 27/0259* (2013.01); *H01L 27/0296* (2013.01); *H01L 27/0922* (2013.01); *H01L 27/0928* (2013.01); *H01L 29/086* (2013.01); *H01L 29/0878* (2013.01); *H01L 29/1095* (2013.01); *H01L 29/7302* (2013.01); *H01L 29/7817* (2013.01)

(58) Field of Classification Search
CPC ............ H01L 27/0623; H01L 27/0922; H01L 29/7302; H01L 29/086; H01L 27/0259; H01L 29/7817; H01L 29/1095; H01L 29/0878; H01L 27/0928; H01L 27/0296
See application file for complete search history.

(56) References Cited

U.S. PATENT DOCUMENTS

| | | | | |
|---|---|---|---|---|
| 6,268,626 B1 * | 7/2001 | Jeon | ..................... | H01L 21/2815 257/288 |
| 6,870,218 B2 * | 3/2005 | Cai | ...................... | H01L 29/1095 257/335 |
| 2002/0195654 A1 * | 12/2002 | Kwon | ................... | H01L 29/7801 257/329 |
| 2003/0141559 A1 * | 7/2003 | Moscatelli | ......... | H01L 21/28167 257/406 |
| 2004/0238913 A1 * | 12/2004 | Kwon | ................... | H01L 27/088 257/492 |
| 2010/0032758 A1 * | 2/2010 | Wang | ................... | H01L 29/7816 257/343 |
| 2010/0102379 A1 * | 4/2010 | Wang | ................... | H01L 29/0696 257/328 |
| 2012/0241900 A1 | 9/2012 | Chen et al. | | |
| 2012/0286362 A1 | 11/2012 | Chan et al. | | |
| 2014/0225156 A1 * | 8/2014 | Zhan | ................... | H01L 29/66325 257/164 |
| 2015/0137255 A1 * | 5/2015 | Wen | ...................... | H01L 27/092 257/369 |

* cited by examiner

*Primary Examiner* — Jarrett Stark
(74) *Attorney, Agent, or Firm* — Finnegan, Henderson, Farabow, Garrett & Dunner LLP

(57) ABSTRACT

A semiconductor device includes first metal-on-semiconductor (MOS), second MOS, and bipolar junction (BJ) structures formed in a substrate. The first MOS structure includes first drain, first channel, and first source regions arranged along a first direction. The first MOS structure further includes a drain electrode formed over and conductively coupled to the first drain region, and a body region formed below and conductively coupled to the channel region. The second MOS structure includes second drain, second channel, and second source regions arranged along a second direction different from the first direction. The BJ structure includes emitter, base, and collector regions. The first source region and the second drain region share a first common semiconductor region in the substrate. The drain electrode and the base region share a second common semiconductor region in the substrate. The body region and the collector region share a third common semiconductor region in the substrate.

20 Claims, 14 Drawing Sheets

SEMICONDUCTOR DEVICE

TECHNOLOGY FIELD

The disclosure relates to semiconductor devices and, more particularly, to electrostatic discharge (ESD) protection devices.

BACKGROUND

Bipolar-CMOS-DMOS (BCD, where CMOS stands for "complementary metal-on-semiconductor" and DMOS stands for "double-diffused metal-on-semiconductor") and triple well process have been widely used in high-voltage (HV) applications, such as electrostatic discharge (ESD) protection. Generally, the ESD performance of an HV ESD protection device depends on a total width of gates of the device, as well as surface or lateral rules of the device. For an HV ESD protection device of smaller size, the surface-bulk ratio is larger as compared to a protection device of larger size, and thus the surface area of the device of smaller size has a larger impact on device performance as compared to that of the device of larger size. As a result, obtaining good ESD performance in devices having relatively small sizes is more challenging. Further, as the operation voltage of a device increases, on-chip ESD protection design also becomes more challenging.

An HV ESD protection device typically has a low on-state resistance ($R_{DS-on}$). When ESD occurs, the ESD current is more likely to concentrate near the surface or the drain of the HV protection device. This results in a higher current density and electric field at surface junction regions, and results in physical damage to these regions during an ESD event. As a result, the surface area of the HV protection device may have a larger impact on its performance as compared to a device having a larger on-state resistance, and thus surface or lateral rules can have a larger effect on the HV protection device.

Other characteristics of an HV protection device include, for example, a high breakdown voltage, which should always be higher than an operation voltage of the HV protection device. Further, a trigger voltage ($V_{t1}$) of the HV device is often much higher than the breakdown voltage of the HV device. Therefore, during an ESD event, the device or internal circuit being protected (also referred to herein as the "protected device/circuit") may face the risk of being damaged before the HV protection device turns on to provide ESD protection. Conventionally, to reduce the trigger voltage of the HV protection device, an additional external ESD detection circuit may be needed.

The HV protection device usually has a low holding voltage, which may result in the HV protection device being triggered by unwanted noise, a power-on peak voltage, or a surge voltage. As a result, latch-up may occur during normal operation.

Further, there may be a field plate effect in the HV protection device. That is, an electric field distribution in the HV protection device is sensitive to routing of wirings that connect different elements or different portions of a device. As a result, as noted above, the ESD current is more likely to concentrate near the surface or the drain of the HV device.

SUMMARY

In accordance with the disclosure, there is provided a semiconductor device including a substrate, and a first metal-on-semiconductor (MOS) structure, a second MOS structure, and a bipolar junction (BJ) structure formed in the substrate. The first MOS structure includes a first drain region, a first channel region, and a first source region arranged along a first direction in this order. The first MOS structure further includes a drain electrode formed over and conductively coupled to the first drain region, and a body region formed below and conductively coupled to the channel region. The second MOS structure includes a second drain region, a second channel region, and a second source region arranged along a second direction different from the fi direction in this order. The BJ structure includes an emitter region, a base region, and a collector region. The first source region and the second drain region share a first common semiconductor region in the substrate. The drain electrode and the base region share a second common semiconductor region in the substrate. The body region and the collector region share a third common semiconductor region in the substrate.

Also in accordance with the disclosure, there is provided a semiconductor device including a substrate, and a high-voltage (HV) metal-on-semiconductor (MOS) structure, a low-voltage (LV) MOS structure, and a bipolar junction (BJ) structure formed in the substrate. The HV MOS structure includes a first semiconductor region having a first-type conductivity and a first doping level, a second semiconductor region formed over the first semiconductor region and having the first-type conductivity and a second doping level higher than the first doping level, a third semiconductor region having a second-type conductivity, and a fourth semiconductor region having the first-type conductivity. The first semiconductor region is a drain region of the HV MOS structure. The second semiconductor region is a drain electrode of the HV MOS structure and conductively coupled to the drain region of the HV MOS structure. The third semiconductor region includes a channel region of the HV MOS structure. The fourth semiconductor region is a source region of the HV MOS structure. The first, third, and fourth semiconductor regions are arranged along a first direction in this order. The LV MOS structure includes the fourth semiconductor region, a fifth semiconductor region having the second-type conductivity, and a sixth semiconductor region having the first-type conductivity. The fourth semiconductor region is a drain region of the LV MOS structure. The fifth semiconductor region is a channel region of the LV MOS structure. The sixth semiconductor region is a source region of the LV MOS structure. The fourth, fifth, and sixth semiconductor regions are arranged along a second direction different from the first direction in this order. The BJ structure includes the second semiconductor region, a seventh semiconductor region formed over the first semiconductor region and in contact with the second semiconductor region, and an eight semiconductor region formed below the third semiconductor region and having the second-type conductivity. The second semiconductor region is a base region of the BJ structure. The seventh semiconductor region has the second-type conductivity and is an emitter region of the BJ structure. The eight semiconductor region is a collector region of the BJ structure and is also a body region of the HV MOS structure. The third and eighth semiconductor regions are parts of a continuous well having the second-type conductivity.

Also in accordance with the disclosure, there is provided a semiconductor device including a substrate, a first well formed in the substrate, a first heavily-doped region formed in the first well, a second well formed in the substrate, a second heavily-doped region formed in the second well, a third heavily-doped region formed in the first well, and a fourth heavily-doped region formed in the second well. The first well has a first-type conductivity and a first doping level. The first heavily-doped region has the first-type conductivity and a second doping level higher than the first doping level. The second well has a second-type conductivity and a third doping level. The second heavily-doped region has the first-type conductivity and a fourth doping level higher than the first doping level. The third heavily-doped region has the second-type conductivity and a fifth doping level higher than the third doping level. The third heavily-doped region is in contact with the first heavily-doped region. The fourth heavily-doped region has the first-type conductivity and a sixth doping level higher than the first doping level. The second well includes a side portion formed between the first well and the second heavily-doped region, and an upper portion formed between the second and fourth heavily-doped regions. The first well, the side portion, and the second heavily-doped region are arranged along a first direction in this order. The second heavily-doped region, the upper portion, and the fourth heavily-doped region are arranged along a second direction different from the first direction in this order.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that 2oth the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Embodiments consistent with the disclosure include a high voltage electrostatic discharge (ESD) protection device.

Hereinafter, embodiments consistent with the disclosure will be described with reference to the drawings. Wherever possible, the same reference numbers will be used throughout the drawings to refer to the same or like parts.

Figure 1:
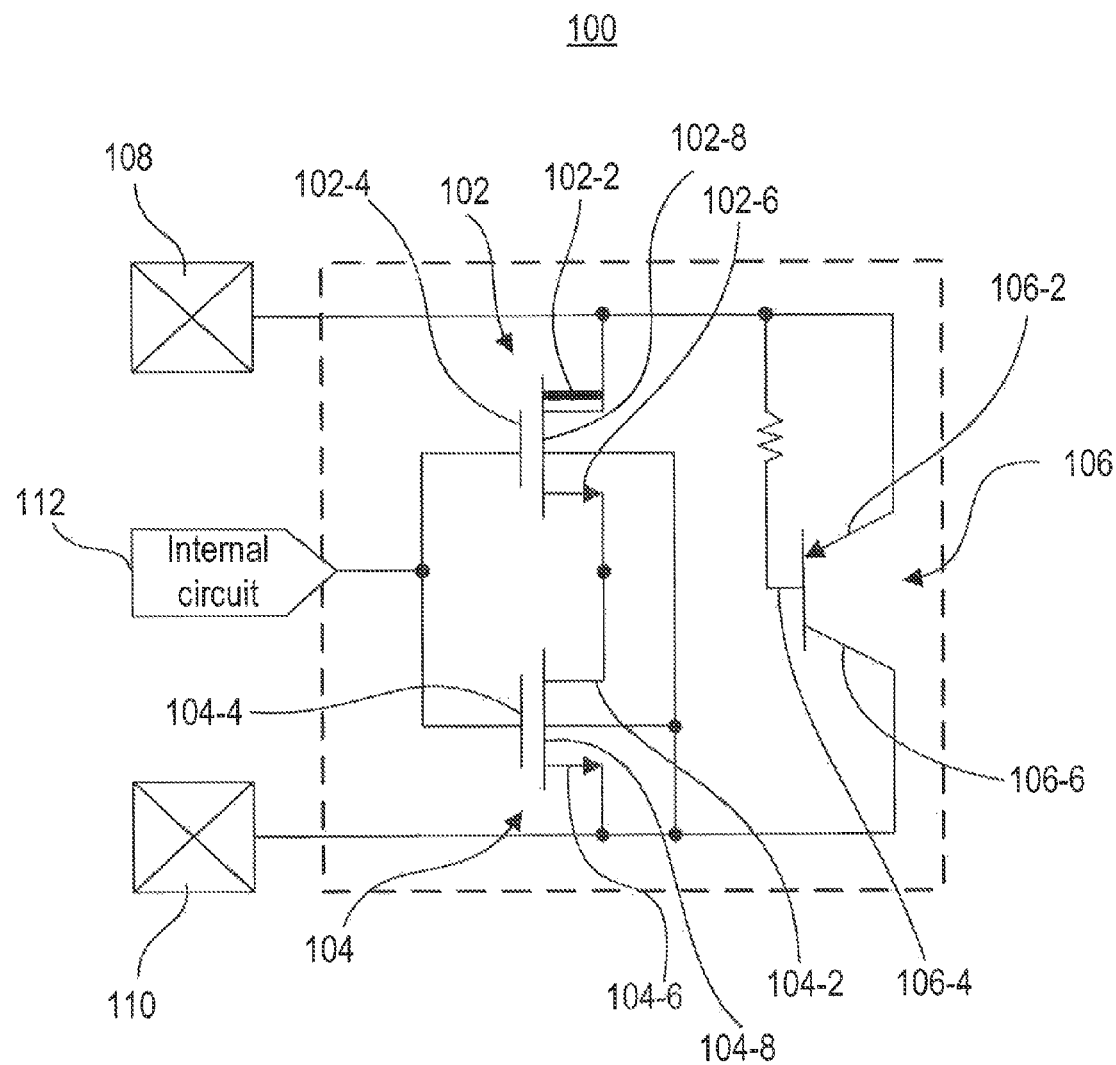
FIG. 1 shows an equivalent circuit of an electrostatic discharge (ESD) protection device according to an exemplary embodiment.

FIG. 1 shows an equivalent circuit of an exemplary high-voltage (HV) ESD protection device 100 consistent with the present disclosure. The ESD protection device 100 includes a HV metal-on-semiconductor (MOS) structure 102, a low-voltage (LV) MOS structure 104, and a bipolar junction (BJ) structure 106 formed in one device. That is, as described below, the HV MOS structure 102, the LV MOS structure 104, and the BJ structure 106 are electrically coupled to each other without use of metal wiring. In the example shown in FIG. 1, both the HV MOS structure 102 and the LV MOS structure 104 are N-channel MOS (NMOS) structures, and the BJ structure 106 is a PNP BJ structure (where "N" and "P" refer to N-type conductivity and P-type conductivity, respectively). In some embodiments, the HV MOS structure 102 and the LV MOS structure 104 may also be P-channel MOS (PMOS) structures and the BJ structure 106 may be an NPN BJ structure.

In the equivalent circuit shown in FIG. 1, the HV MOS structure 102 includes a drain (also referred to as an "HV drain") 102-2, a gate (also referred to as an "HV gate") 102-4 a source (also referred to as an "HV source") 102-6, and a body (also referred to as an "HV body") 102-8. A channel of the HV MOS structure 102 for conducting current between the HV drain 102-2 and the HV source 102-6 is formed in the HV body 102-8. The LV MOS structure 104 includes a drain (also referred to as an "LV drain") 104-2, a gate (also referred to as an "LV gate") 104-4, a source (also referred to as a "LV source") 104-6, and a body (also referred to as an "LV body") 104-8. A channel of the LV MOS structure 104 for conducting current between the LV drain 104-2 and the LV source 104-6 is formed in the LV body 104-8.

As shown in FIG. 1, the BJ structure 106 includes an emitter 106-2, a base 106-4, and a collector 106-6. The HV drain 102-2 and the emitter 106-2 are electrically coupled to each other and to a terminal 108 connectable to a power supply (the terminal 108 is also referred to as a "power supply terminal"). The LV source 104-6 and the collector 106-6 are electrically coupled to each other and to a terminal 110 connectable to a circuit ground (the terminal 110 is also referred to as a "circuit ground terminal"). The base 106-4 is electrically coupled to the power supply terminal 108 through a resistor, which may be an internal resistor in a semiconductor substrate in which the HV MOS structure 102, the LV MOS structure 104, and the BJ structure 106 are formed. As shown in FIG. 1, the HV gate 102-4 and the LV gate 104-4 are electrically coupled to each other and are also electrically coupled to an internal circuit 112 protected by the ESD protection device 100.

In the equivalent circuit shown in FIG. 1, the HV source 102-6 and the LV drain 104-2 are electrically coupled to each other. As will be described later and consistent with embodiments of the present disclosure, the HV source 102-6 and the LV drain 104-2 physically share a common region in the ESD protection device 100. In other words, a common semiconductor region in the ESD protection device 100 serves as both a source region of the HV MOS structure 102 and a drain region of the LV MOS structure 104. Therefore, in a circuit layout of the ESD protection device 100, a wiring connecting the HV sauce 102-6 and the LV drain 104-2 can be omitted, resulting in a smaller footprint. Consequently, a size of the ESD protection device 100 can be reduced.

Further, in the equivalent circuit shown in FIG. 1, the HV drain 102-2 and the base 106-4 are electrically coupled to each other. As will be described later and consistent with embodiments of the present disclosure, the base 106-4 also serves as a drain electrode of the HV MOS structure 102, i.e., the base 106-4 of the BJ structure 106 and the drain electrode of the HV MOS structure 102 physically share a common region in the ESD protection device 100. Moreover, the HV body 102-8, the LV body 104-8, and the collector 106-6 are electrically coupled to each other. As will be described later and consistent with embodiments of the present disclosure, the HV body 102-8, the LV body 104-8, and the collector 106-6 physically share another common region in the ESD protection device 100.

Figure 2:
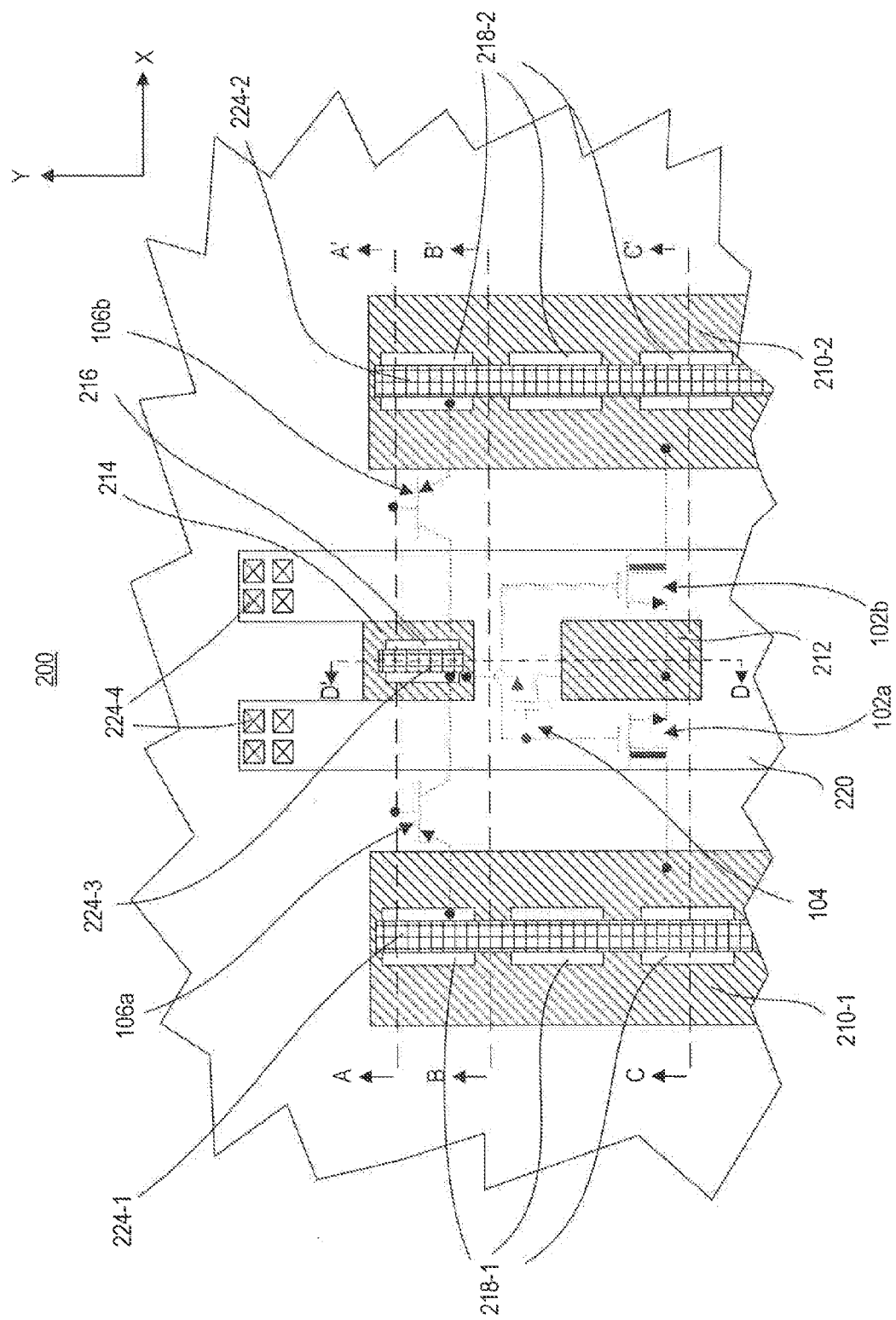
FIG. 2 is a plan view schematically showing a portion of an ESD protection device according to an exemplary embodiment.

FIG. 2 is a plan view schematically showing a portion of an ESD protection device 200 consistent with embodiments of the present disclosure. FIGS. 3A, 3B, 3C, and 3D are cross-sectional views of the ESD protection device 200 taken along cut-lines AA', BB', CC', and DD', respectively, in FIG. 2. As shown in FIG. 2, the out-lines AA', BB', and CC' extend along an X-direction and the cut-line DD' extends along a Y-direction. The X-direction is perpendicular to the Y-direction. The ESD protection device 200 has a corresponding equivalent circuit as shown in FIG. 1. The corresponding HV MOS, LV MOS, and BJ structures are schematically illustrated in FIGS. 2, 3A, 3C, and 3D by dotted lines.

Figure 3A:
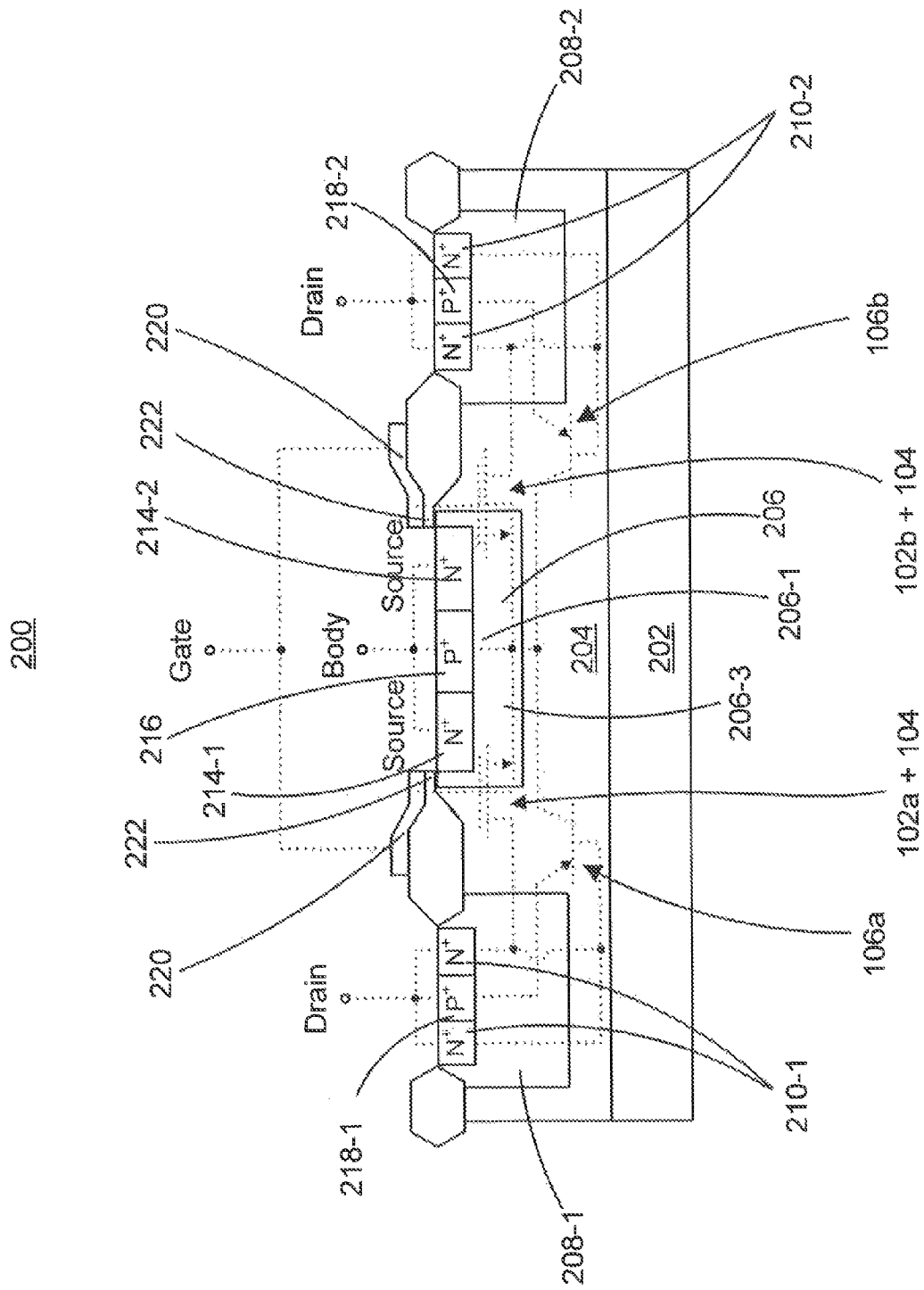
FIGS. 3A-3D are cross-sectional views of the ESD protection device shown in FIG. 2.
Figure 3B:
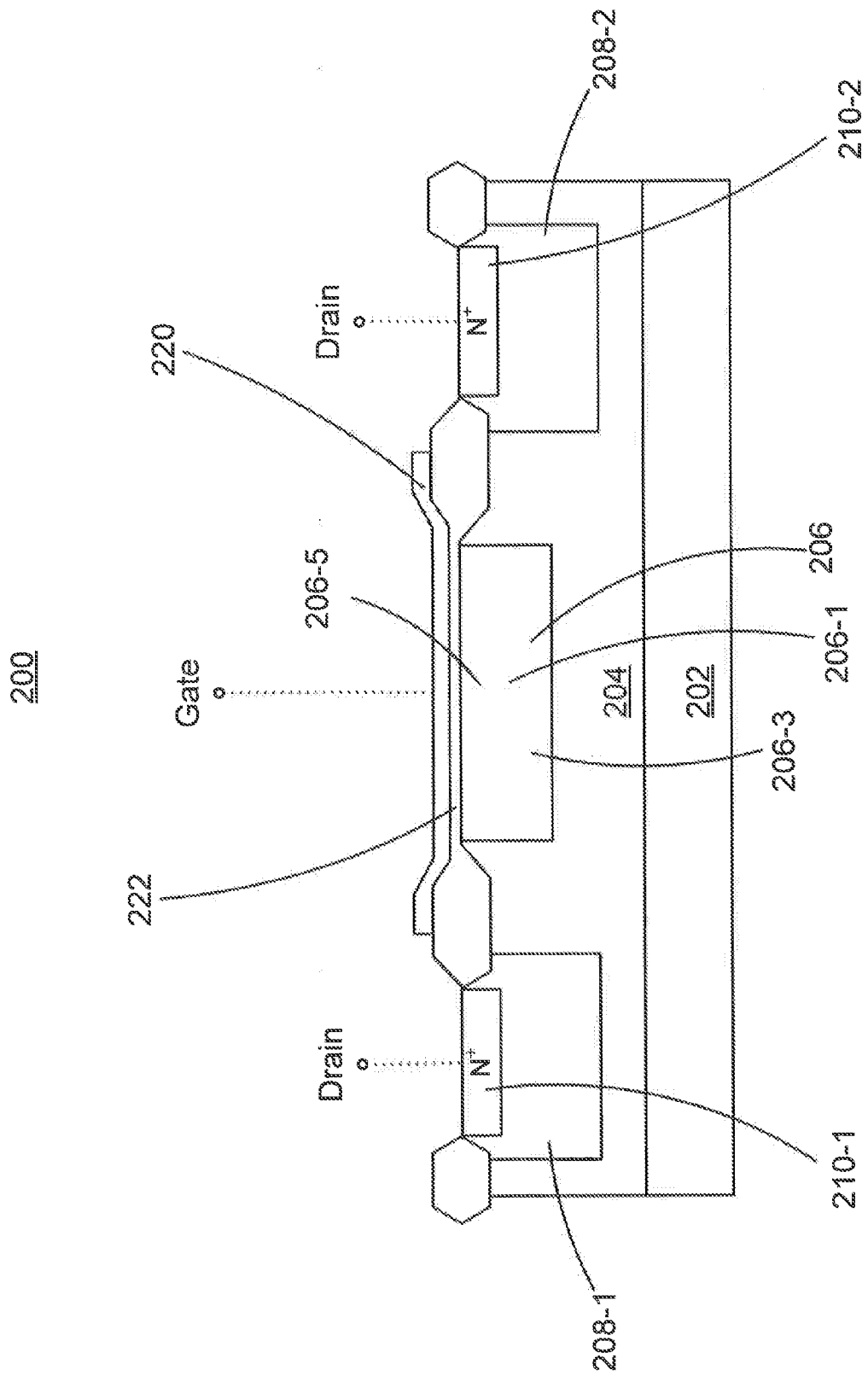
Figure 3C:
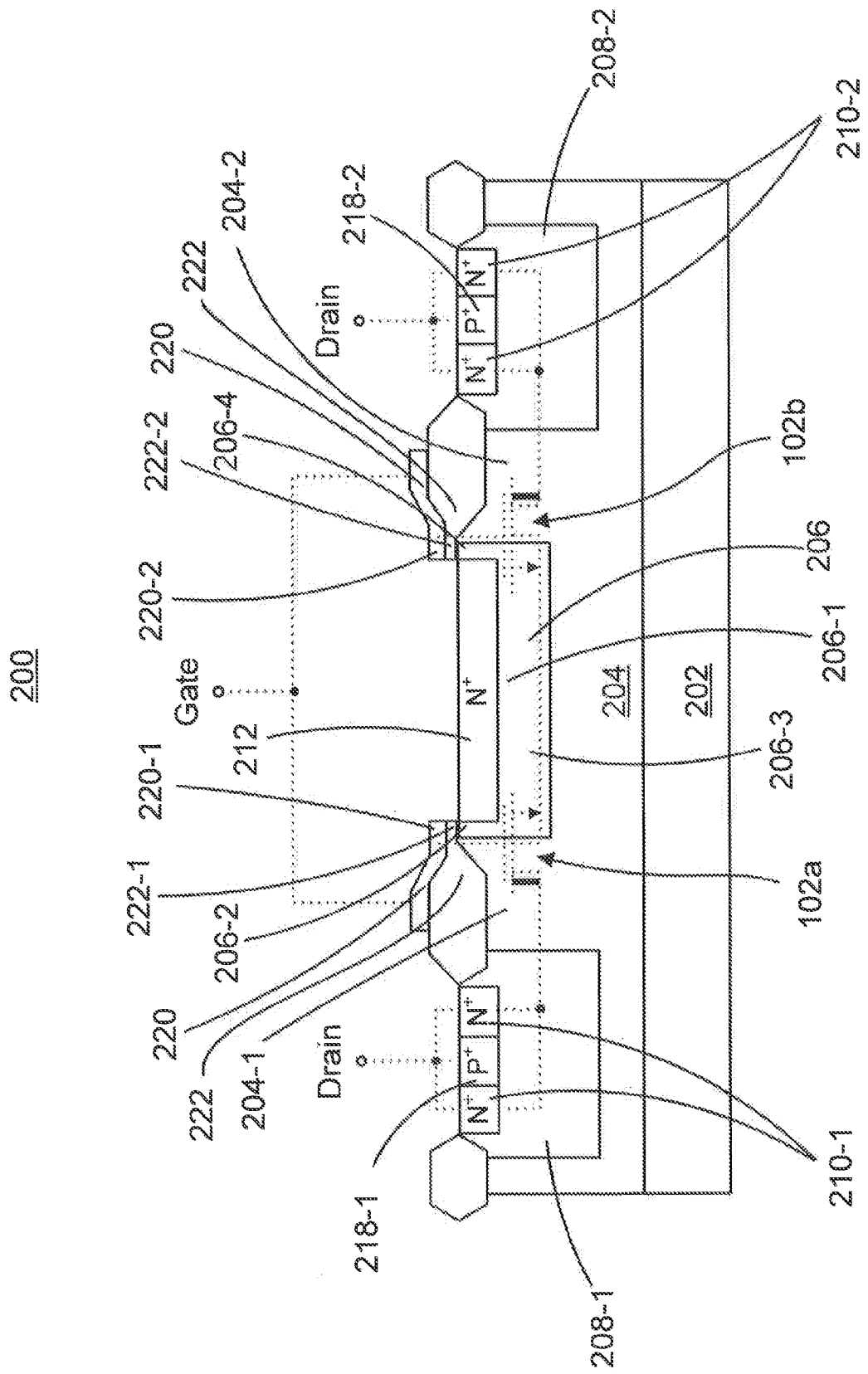

Referring to FIGS. 2 and 3A-3D, the ESD protection device 200 includes a P-type substrate 202, an HV N-type well (HV N-Well) 204 formed in the P-type substrate 202, and a P-type well (P-Well) 206 formed in the HV N-Well 204. As shown in FIGS. 2 and 3A-3C, the ESD protection device 200 has a symmetrical structure in the X-direction with respect to a middle portion 206-1 of the P-Well 206 (hereinafter also referred to as "P-Well middle portion 206-1"). Therefore, in the ESD protection device 200, a region or structure on the left side of the P-Well middle portion 206-1 has a corresponding similar region or structure on the right side of the P-Well middle portion 206-1. For example, as shown in FIGS. 2 and 3C, the HV MOS structure 102 includes a first sub HV MOS structure 102a and a second sub HV MOS structure 102b formed approximately symmetrical to each other with respect to the P-Well middle portion 206-1. Similarly, the BJ structure 106 includes a first sub BJ structure 106a and a second sub BJ structure 106b formed approximately symmetrical to each other with respect to the P-Well middle portion 206-1. The LV MOS structure 104 is formed along the Y-direction over the P-Well middle portion. In FIG. 3A, numeral 102a+104 denotes an overall structure of the first sub HV MOS structure 102a and the LV MOS structure 104, and numeral 102b+104 denotes an overall structure of the second sub HV MOS structure 102b and the LV MOS structure 104.

The ESD protection device 200 also includes a first N-Well 208-1 and a second N-Well 208-2 formed in and electrically coupled to the HV N-Well 204. The first and second N-Wells 208-1 and 208-2 are arranged approximately symmetrical to each other with respect to the P-Well middle portion 206-1. A first heavily-doped N-type ($N^+$) region 210-1 and a second $N^+$ region 210-2 are formed in or above the first and second N-Wells 208-1 and 208-2, respectively. The first and second $N^+$ regions 210-1 and 210-2 are electrically coupled to the first and second N-Wells 208-1 and 208-2, respectively, and are arranged approximately symmetrical to each other with respect to the P-Well middle portion 206-1. In the present disclosure, a heavily-doped region may refer to a region having a doping level, or impurity concentration, of about $1 \times 10^{15}$ cm$^{-3}$ to about $1 \times 10^{20}$ cm$^{-3}$ or higher.

The ESD protection device 200 further includes a third $N^+$ region 212 and a fourth $N^+$ region 214 formed in the P-Well 206 and arranged along the Y-direction. The third and fourth $N^+$ region 212 and 214 are similar to each other, except that a first heavily-doped P-type ($P^+$) region 216 is formed in the fourth $N^+$ region 214 (as shown in FIGS. 2 and 3A) but no P-type region is formed in the third $N^+$ region 212 (as shown in FIGS. 2 and 3C). As shown in FIG. 3A, the first $P^+$ region 216 is formed all the way through the fourth $N^+$ region 214, and is in physical and electrical contact with the P-Well 206. Thus, the fourth $N^+$ region 214 includes a left sub region 214-1 and a right sub region 214-2 arranged respectively on the two sides of the first $P^+$ region 216, and are approximately symmetrical to each other with respect to the P-Well middle portion 206-1.

As shown in FIGS. 2, 3A, and 3C, similar to the P-Well 206, the third and fourth $N^+$ regions 212 and 214 are also arranged in the center of the ESD protection device 200 along the X-direction. Therefore, regions or structures that are approximately symmetrical with respect to the P-Well middle portion 206-1 are also approximately symmetrical with respect to the third or fourth $N^+$ region 212 or 214.

As shown in FIGS. 2, 3A, and 3C, the ESD protection device 200 further includes a second $P^+$ region 218-1 and a third $P^+$ region 218-2, formed in the first and second $N^+$ regions 210-1 and 210-2, respectively, and over the first and second N-Wells 208-1 and 208-2. As shown in FIGS. 3A and 3C, the second and third $P^+$ regions 218-1 and 218-2 are formed all the way through the first and second $N^+$ regions 210-1 and 210-2, respectively, and are in contact with the first and second N-Wells 208-1 and 208-2, respectively.

In the ESD protection device 200, the P-type substrate 202 may be a P-type wafer (such as a P-type silicon wafer), a P-type layer epitaxially grown on a growth substrate, or a P-type silicon-on-insulator substrate. An impurity concentration, i.e., doping level, in the P-type substrate is about $1 \times 10^{10}$ cm$^{-3}$ to about $1 \times 10^{15}$ cm$^{-3}$. In some embodiments, the HV N-Well 204 can be formed by incorporating N-type impurities, such as antimony, arsenic, or phosphorous, into the P-type substrate 202 by, for example, ion implantation or diffusion. In some embodiments, the HV N-Well 204 can be formed by epitaxially growing an N-type semiconductor layer over the P-type substrate 202. The HV N-Well 204 may also include a plurality of N-type buried layers stacked together. In some embodiments, an impurity concentration, i.e., doping level, in the HV N-Well 204 is about $1 \times 10^{10}$ cm$^{-3}$ to about $1 \times 10^{16}$ cm$^{-3}$.

The P-Well 206 may be formed by incorporating P-type impurities, such as boron, aluminum, or gallium, into the HV N-Well 204 by, for example, ion implantation or diffusion. In some embodiments, the P-Well 206 may include a plurality of P-type buried layers stacked together. In some embodiments, an impurity concentration, i.e., doping level in the P-Well 206 is about $1 \times 10^{12}$ cm$^{-3}$ to about $1 \times 10^{20}$ cm$^{-3}$.

The first and second N-Wells 208-1 and 208-2 can be formed by incorporating additional N-type impurities into the HV N-Well 204. Therefore, impurity concentrations in the first and second N-Wells 208-1 and 208-2 are higher than the impurity concentration in the HV N-Well 204. In some embodiments, the impurity concentrations in the first and second N-Wells 208-1 and 208-2 are in the range from about $1 \times 10^{10}$ cm$^{-3}$ to about $1 \times 10^{16}$ cm$^{-3}$. The first and second $N^+$ regions 210-1 and 210-2 can be formed by incorporating additional N-type impurities into the first and second N-Wells 208-1 and 208-2, respectively. In some embodiments, impurity concentrations in the first and second $N^+$ regions 210-1 and 210-2 are in the range from about $1 \times 10^{15}$ cm$^{-3}$ to about $1 \times 10^{20}$ cm$^{-3}$.

The third and fourth $N^+$ regions 212 and 214 can be formed by incorporating N-type impurities into the P-Well 206. In some embodiments, an impurity concentration in each of the third N+ region 212 and the fourth N+ region 214 is in the range from about $1\times10^{15}$ cm$^{-3}$ to about $1\times10^{20}$ cm$^{-3}$. In some embodiments, the N+ regions 210-1, 210-2, 212, and 214 are formed in the same doping step, such as the same ion implantation step or the same diffusion step.

The first P+ region 216 can be formed by incorporating P-type impurities into the fourth N+ region 214. In some embodiments, the impurity concentration in the first P+ region 216 is in the range from about $1\times10^{15}$ cm$^{-3}$ to about $1\times10^{20}$ cm$^{-3}$. Similarly, the second and third P+ regions 218-1 and 218-2 can be formed by incorporating P-type impurities into the first and second N+ regions 210-1 and 210-2, respectively. In some embodiments, impurity concentrations in the second and third P+ regions 218-1 and 218-2 are in the range from about $1\times10^{15}$ cm$^{-3}$ to about $1\times10^{20}$ cm$^{-3}$. In some embodiments, the P+ regions 216, 218-1, and 218-2 are formed in the same doping step, such as the same ion implantation step or diffusion step.

As shown in FIGS. 2 and 3A-3D, the ESD protection device 200 also includes a continuous polysilicon layer 220 formed over the HV N-Well 204 and the P-Well 206, and an insulation layer 222 formed between the continuous polysilicon layer 220 and the HV N-Well 204 or the P-Well 206. Various portions of the continuous polysilicon layer 220 constitute gate electrodes of various MOS structures in the ESD protection device 200. Further, various portions of the insulation layer 222 constitute gate dielectric films corresponding to the above-mentioned gate electrode portions of the continuous polysilicon layer. The insulation layer 222 may be, for example, an oxide layer.

Consistent with the present disclosure, different regions described above serve as different functional components of the first and second sub HV MOS structures 102a and 102b, different functional components of the LV MOS structure 104, and different functional components of the first and second sub BJ structures 106a and 106b, as described in detail below.

The first sub HV MOS structure 102a includes the first N-Well 208-1, the first N+ region 210-1, a portion of the HV N-Well 204 (hereinafter also referred to as a "first HV N-Well portion 204-1") that is between the first N-Well 208-1 and the P-Well 206, a portion of the P-Well 206 (hereinafter also referred to as a "first P-Well side portion 206-2") that is between the first HV N-Well portion 204-1 and the third N+ region 212, another portion of the P-Well 206 (hereinafter also referred to as a "P-Well bottom portion 206-3") that is connected to the first P-Well side portion 206-2, and the third N+ region 212. Consistent with the present disclosure, the first N-Well 208-1, the first N+ region 210-1, the first HV N-Well portion 204-1, the first P-Well side portion 206-2, the P-Well bottom portion 206-3, the first P+ region 216, and the third N+ region 212 serve as a drain region, a drain electrode, a drift region, a channel region, a body region, and a source region, respectively, of the first sub HV MOS structure 102a. As understood by one of ordinary skill in the art, the drift region refers to a region in a transistor device between a drain region of the transistor and a channel region of the transistor and/or a region between a source region of the transistor and the channel region that is usually relatively more lightly doped as compared to the drain region or the source region, and helps to increase a breakdown voltage of the transistor.

Similarly, the second sub HV MOS structure 102b includes the second N-Well 208-2, the second N+ region 210-2, another portion of the HV N-Well 204 (hereinafter also referred to as a "second HV N-Well portion 204-2") that is between the second N-Well 208-2 and the P-Well 206, another portion of the P-Well 206 (hereinafter also referred to as a "second P-Well side portion 206-4") that is between the second HV N-Well portion 204-2 and the third N+ region 212, the P-Well bottom portion 206-3, and the third N+ region 212. Consistent with the present disclosure, the second N-Well 208-2, the second N+ region 210-2, the second HV N-Well portion 204-2, the second P-Well side portion 206-4, the P-Well bottom portion 206-3, and the third N+ region 212 serve as a drain region, a drain electrode, a drift region, a channel region, a body region, and a source region, respectively, of the second sub HV MOS structure 102b.

The LV MOS structure 104 includes the third N+ region 212, another portion of the P-Well 206 (hereinafter also referred to as a "P-Well upper portion 206-5") that is immediately beneath the insulation layer 222 and between the third and fourth N+ regions 212 and 214, the P-Well bottom portion 206-3, and the fourth N+ region 214. Consistent with the present disclosure, the third N+ region 212, the P-Well upper portion 206-5, the P-Well bottom portion 206-3, and the fourth N+ region 214 serve as a drain region, a channel region, a body region, and a source region, respectively, of the LV MOS structure 104.

As shown in FIG. 1, the body 102-8 of the HV MOS 102 and the body 104-8 of the LV MOS 104 are electrically coupled to each other and are also electrically coupled to the circuit ground terminal 108. As shown in FIGS. 3A-3D and described above, the channel regions, as well as body regions, of various MOS structures 102a, 102b, and 104 include different portions of the continuous P-Well 206, and thus are electrically coupled to each other. Consistent with the present disclosure, the first P+ region 216, which is physically and electrically in contact with the P-Well 206, also serves as a body electrode of the MOS structures 102a, 102b, and 104.

As shown in, e.g., FIG. 3C, the first N-Well 208-1, the first HV N-Well portion 204-1, the first P-Well side portion 206-2, the third N+ region 212, the second P-Well side portion 206-2, the second HV N-Well portion 204-2, and the second N-Well 208-2 are arranged along the X-direction, in that order. Moreover, the first and second N-Wells 208-1 and 208-2 are arranged approximately symmetrical to each other with respect to the P-Well middle portion 206-1. The first and second HV N-Well portions 204-1 and 204-2 are arranged approximately symmetrical to each other with respect to the P-Well middle portion 206-1. The first and second P-Well side portions 206-2 and 2064 are arranged approximately symmetrical to each other with respect to the P-Well middle portion 206-1.

Figure 3D:
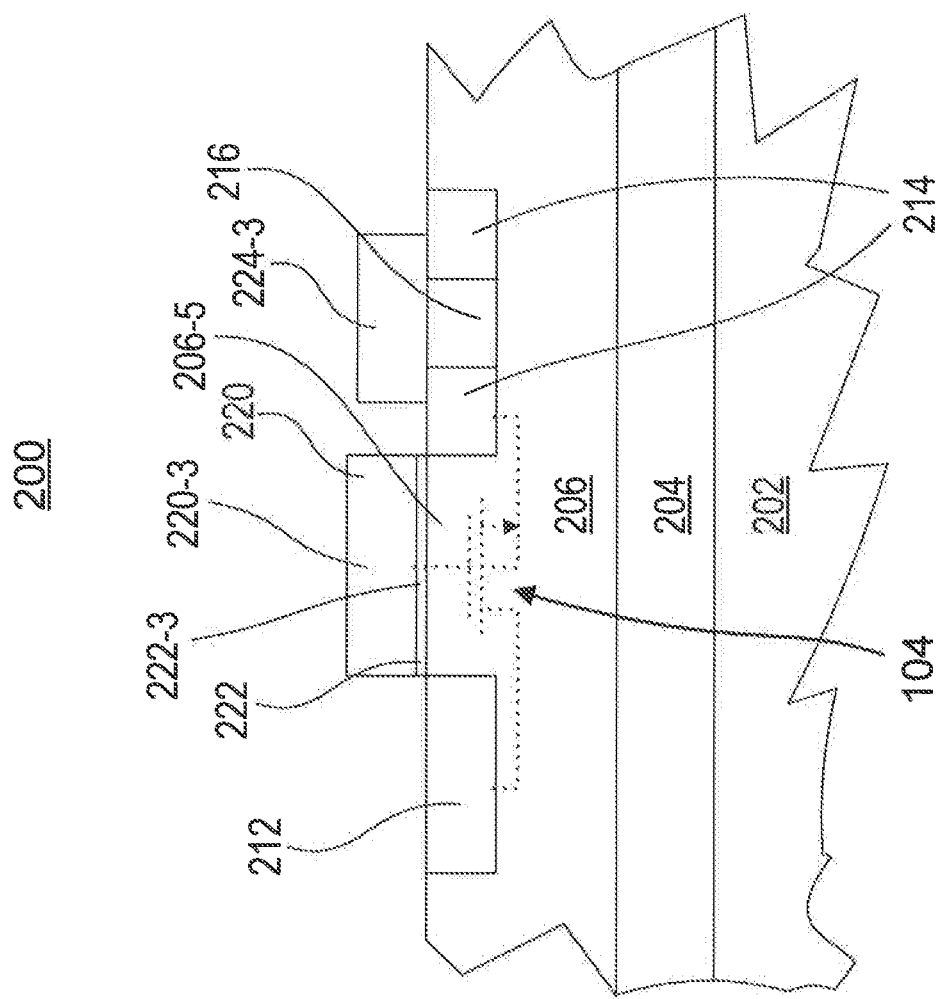

As shown in FIG. 3D, the third N+ region 212, the P-Well upper portion 206-5, and the fourth N+ region 214 are arranged along the Y-direction, in that order.

As shown in, e.g., FIGS. 3C and 3D, the polysilicon layer 220 includes a first polysilicon portion 220-1 serving as a gate electrode of the first sub HV MOS structure 102a, a second polysilicon portion 220-2 serving as a gate electrode of the second sub HV MOS structure 102b, and a third polysilicon portion 220-3 serving as a gate electrode of the LV MOS structure 104. Correspondingly, the insulation layer 222 includes a first thin insulation portion 222-1, a second thin insulation portion 222-2, and a third thin insulation portion 222-3, serving as gate dielectric films of the first sub HV MOS structure 102a, the second sub HV MOS structure 102b, and the LV MOS structure 104, respectively.

As shown in, e.g., FIG. 3A, the first sub BJ structure 104a includes the second P+ region 218-1, the first N+ region 210-1, the P-Well 206, and the first P+ region 216, which serve as an emitter region, a base region, a collector region, and a collector electrode, respectively, of the first sub BJ structure 104a.

Similarly, the second sub BJ structure 104*b* includes the third P⁺ region 218-2, the second N⁺ region 210-2, the P-Well 206, and the first P⁺ region 216, which serve as an emitter region, a base region, a collector region, and a collector electrode, respectively, of the second sub-BJ structure 104-*b*.

As shown in FIG. 2, the ESD protection device 200 includes a first contact 224-1 formed over and electrically coupled to the first N⁺ region 210-1 and the second P⁺ region 218-1, and a second contact 224-2 formed over and electrically coupled to the second N⁴ region 210-2 and the third P⁺ region 218-2. For simplicity of illustration, the first and second contacts 224-1 and 224-2 are omitted in FIGS. 3A-3C. As shown in FIGS. 2 and 3D, the ESD protection device 200 further includes a third contact 224-3 formed over and electrically coupled to the fourth N⁺ region 214 and the first P⁺ region 216. As shown in FIG. 2, the ESD protection device 200 also includes fourth contacts 224-4 formed over and electrically coupled to the polysilicon layer 220.

Consistent with the present disclosure, the first contact 224-1 serves as both a drain contact of the first sub HV MOS structure 102*a* and an emitter contact of the first sub BJ structure 106*a*, and is electrically coupled to the power supply terminal 106 (not shown in FIG. 2). The second contact 224-2 serves as both a drain contact of the second sub HV MOS structure 102*b* and an emitter contact of the second sub BJ structure 106*b*, and is electrically coupled to the power supply terminal 106. The third contact 224-3 serves as both a source contact of the LV MOS structure 104 and a collector contact of the BJ structure 106 (including the first and second sub BJ structures 106*a* and 106*b*), and is electrically coupled to the circuit ground terminal 110 (not shown in FIGS. 2 and 3D). The fourth contacts 224-4 serve as gate contacts of both the HV MOS structure 102 and the LV MOS structure 104, and are electrically coupled to the internal circuit 112 (not shown in FIG. 2).

Each of the first, second, third, and fourth contacts 224-1, 224-2, 224-3, and 224-4 may be formed by depositing a metal, such as aluminum, over corresponding underlying regions. In some embodiments, the first, second, third, and fourth contacts 224-1, 224-2, and 224-3 are formed at the same time by depositing a layer of metal over the entire substrate and then patterning.

As described above, in the ESD protection device 200, the HV MOS structure 102 (including the first and second sub HV MOS structures 102*a* and 102*b*) is formed in the substrate 202 with different functional regions arranged along the X-direction, while the LV MOS structure 104 is formed in the substrate 202 with different functional regions arranged along the Y-direction. This arrangement is schematically illustrated in the plan view of FIG. 2. Moreover, the LV MOS structure 104 is formed utilizing a middle portion of the HV MOS structure 102. Therefore, no additional wafer area is needed for forming the LV MOS structure 104. Further, as mentioned above, the HV MOS structure 102 and the LV MOS structure 104 use a common semiconductor region, i.e., the third N⁺ region 212, as the source region and the drain region, respectively. As a result, the HV MOS structure 102 and the LV MOS structure 104 are electrically coupled to each other without the need for additional wirings, and no contact is formed over and electrically coupled to the third N⁺ region 212. As a consequence of the above-described arrangements, the size of the ESD protection device 200 is reduced, and no additional photolithographic mask is needed for manufacturing the ESD protection device 200 as compared to the manufacturing of a conventional ESD protection device that only includes an HV MOS structure.

Figure 4A:
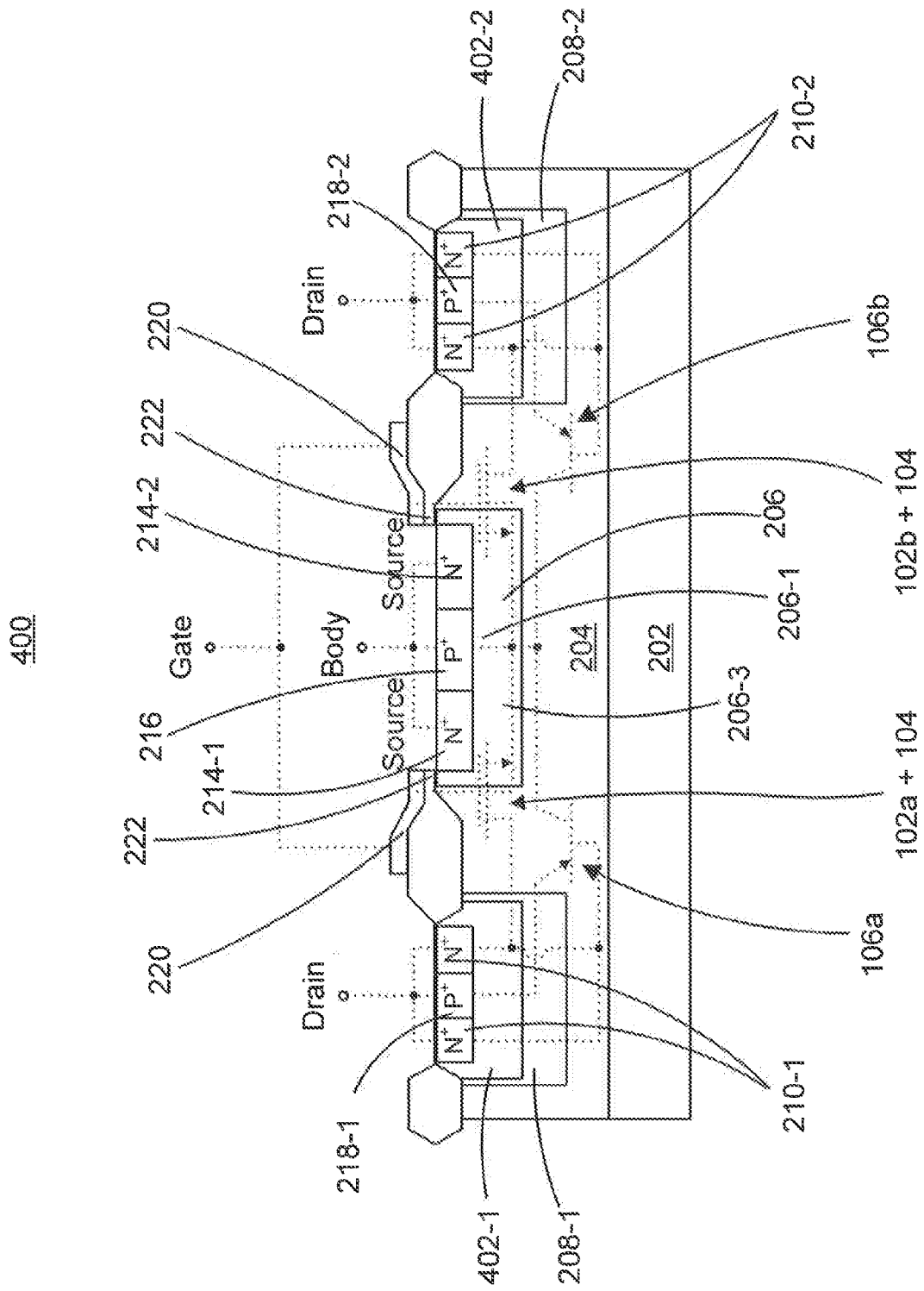
FIGS. 4A-4C are cross-sectional views schematically showing a portion of an ESD protection device according to another exemplary embodiment.
Figure 4B:
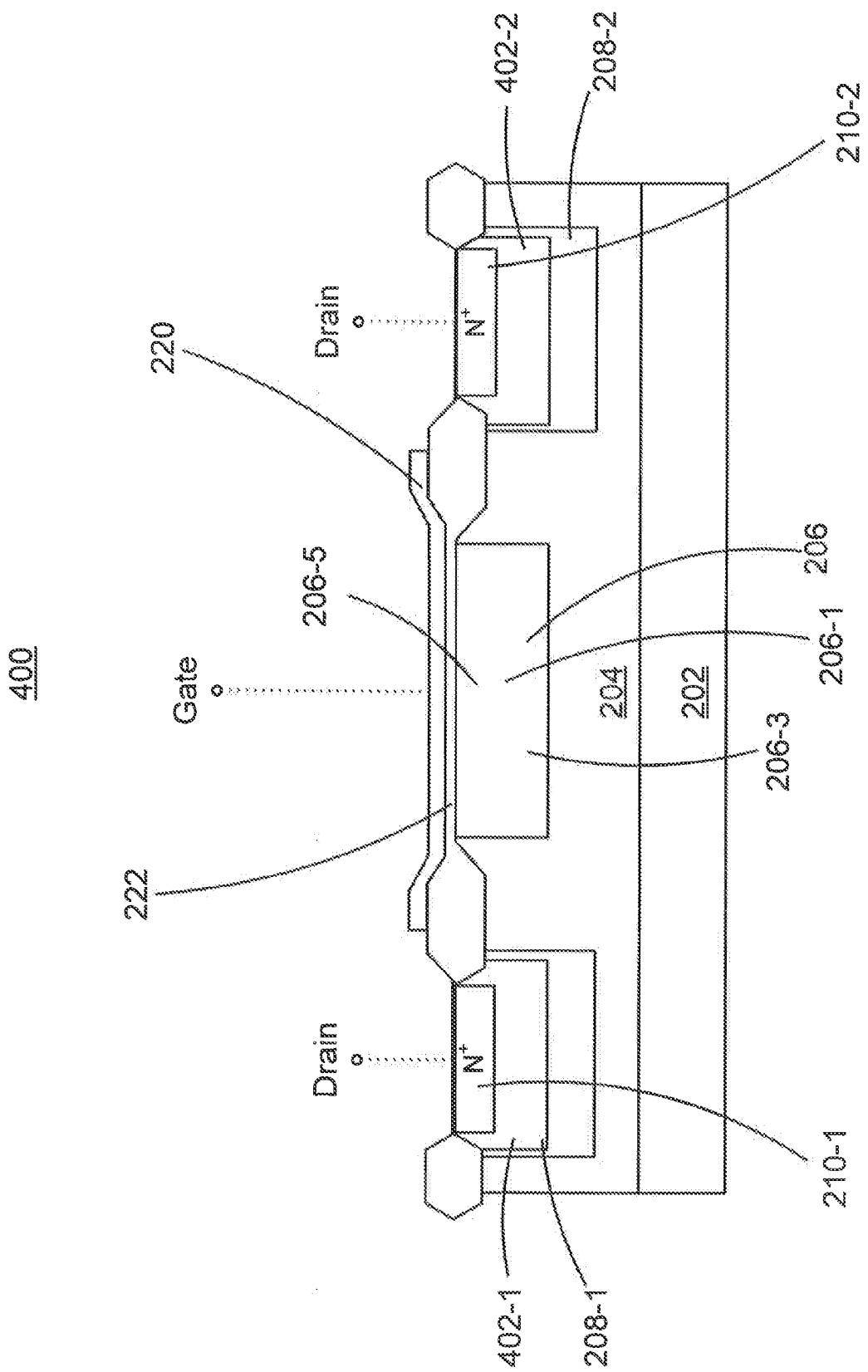
Figure 4C:
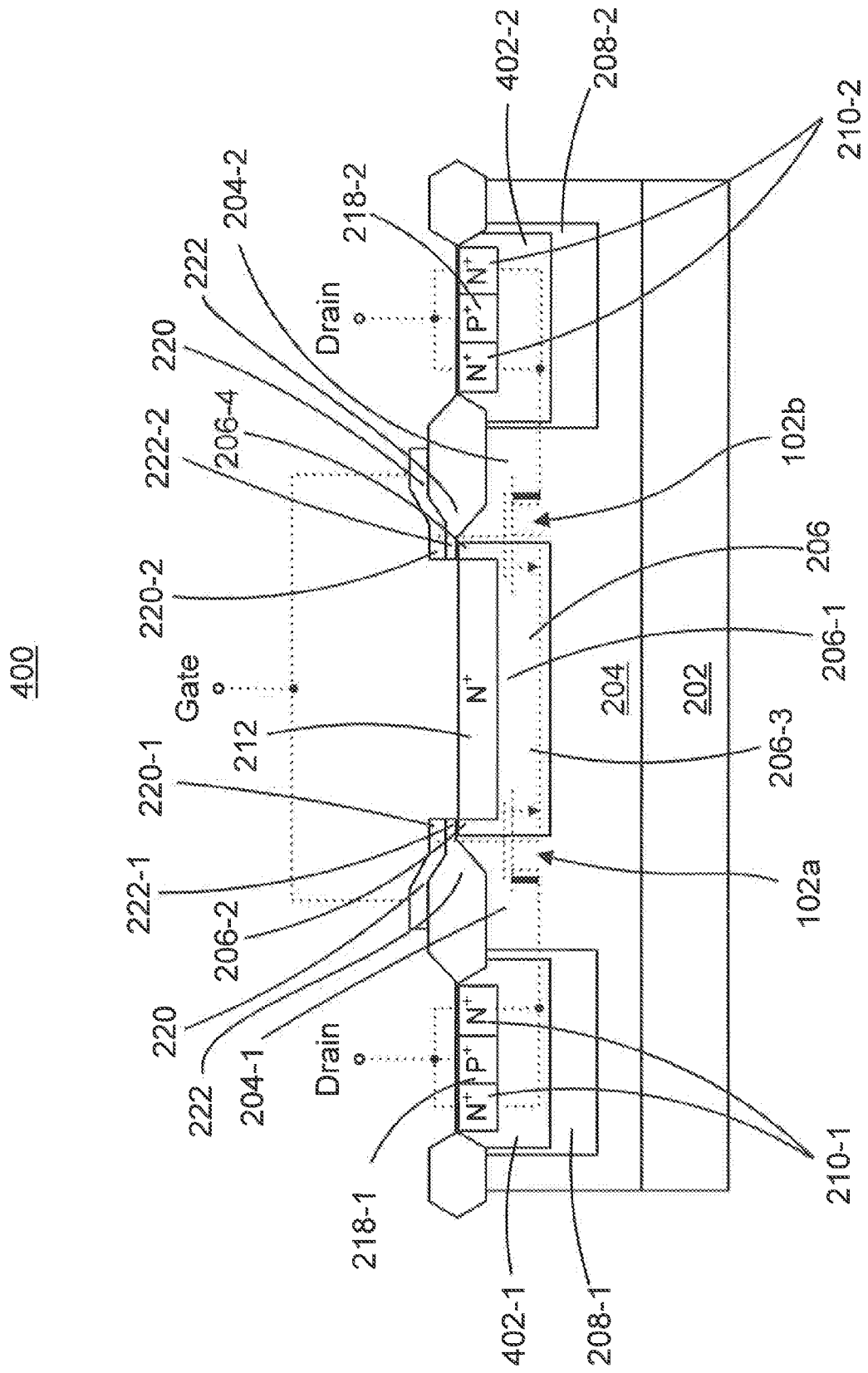

FIGS. 4A-4C show another ESD protection device 400 consistent with embodiments of the present disclosure. The plan view of the ESD protection device 400 is the same as that of the ESD protection device 200 shown in FIG. 2, and therefore is not repeated. FIGS. 4A-4C are cross-sectional views of the ESD protection device 400 taken along the cut-lines AA', BB', and CC' of the plan view in FIG. 2. A cross-sectional view of the ESD protection device 400 taken along the cut-line DD' of the plan view in FIG. 2 is the same as the cross-sectional view of the ESD protection device 200 shown in FIG. 3D, and therefore is not repeated.

The ESD protection device 400 is similar to the ESD protection device 200, except that the ESD protection device 400 further includes first and second shallow N-Wells 402-1 and 402-2. The first and second shallow N-Wells 402-1 and 402-2 may be formed by incorporating additional N-type impurities into the first and second N-Wells 208-1 and 208-2, respectively. Therefore, impurity concentrations in the first and second shallow N-Wells 402-1 and 402-2 are higher than the impurity concentrations in the first and second N-Wells 208-1 and 208-2, respectively. In this embodiment, the first and second N⁺ regions 210-1 and 210-2 may be formed by incorporating additional N-type impurities into the first and second shallow N-Wells 402-1 and 402-2, respectively, and therefore impurity concentrations in the first and second shallow N-Wells 402-1 and 402-2 are lower than the impurity concentrations in the first and second N⁺ regions 210-1 and 210-2, respectively. In some embodiments, the impurity concentrations in the first and second shallow N-Wells 402-1 and 402-2 are in the range from about $1 \times 10^{15}$ cm⁻³ to about $1 \times 10^{20}$ cm⁻³. Consistent with the present disclosure, with the additional shallow N-Wells 402-1 and 402-2, the first and second sub BJ structures 106*a* and 106*b* shown in FIGS. 4A-4C can be more easily turned on as compared to the first and second sub BJ structures 106*a* and 106*b* shown in FIGS. 3A-3D.

Figure 5A:
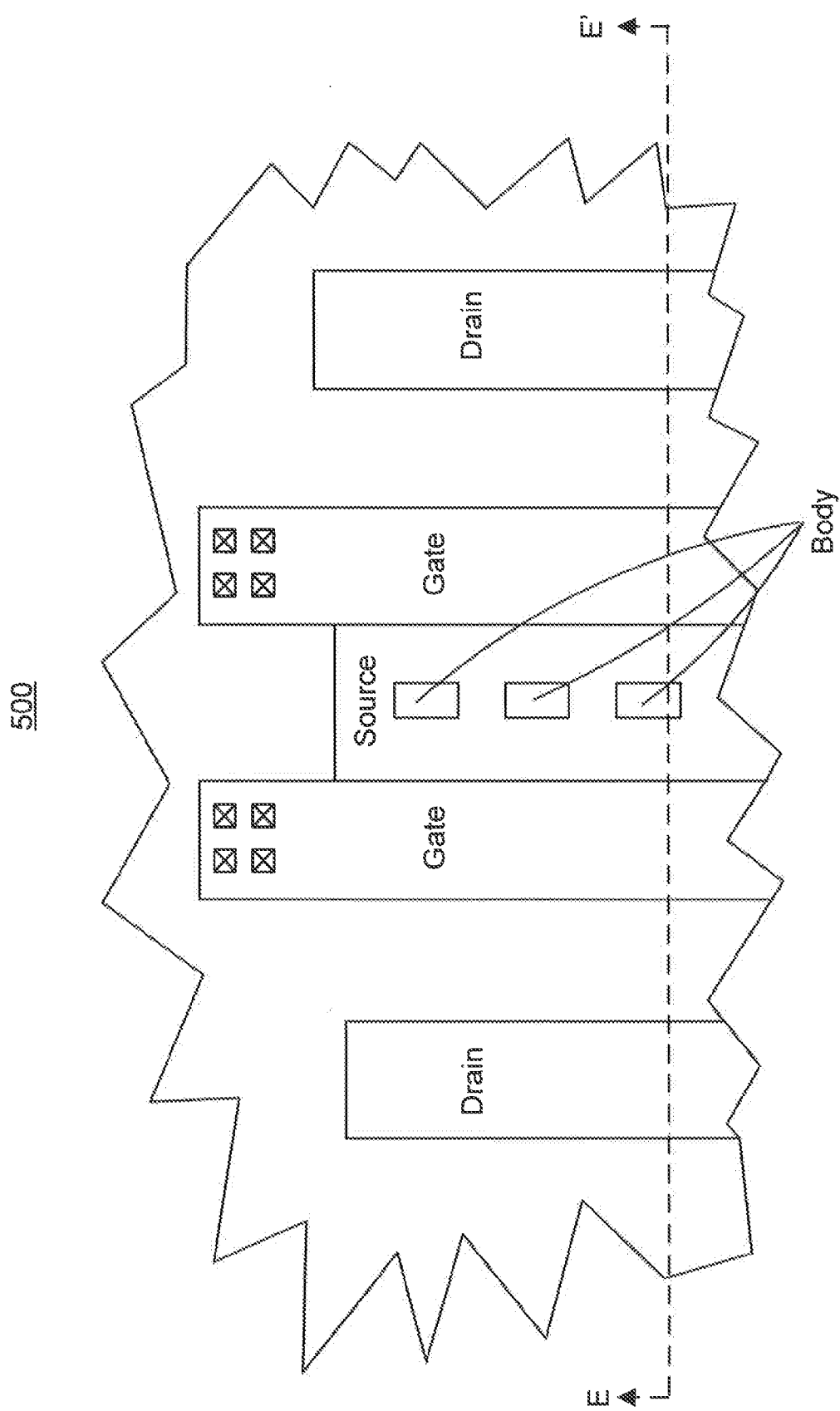
FIGS. 5A and 5B are a plan view and a cross-sectional view, respectively, schematically showing a portion of a conventional ESD protection device.
Figure 5B:
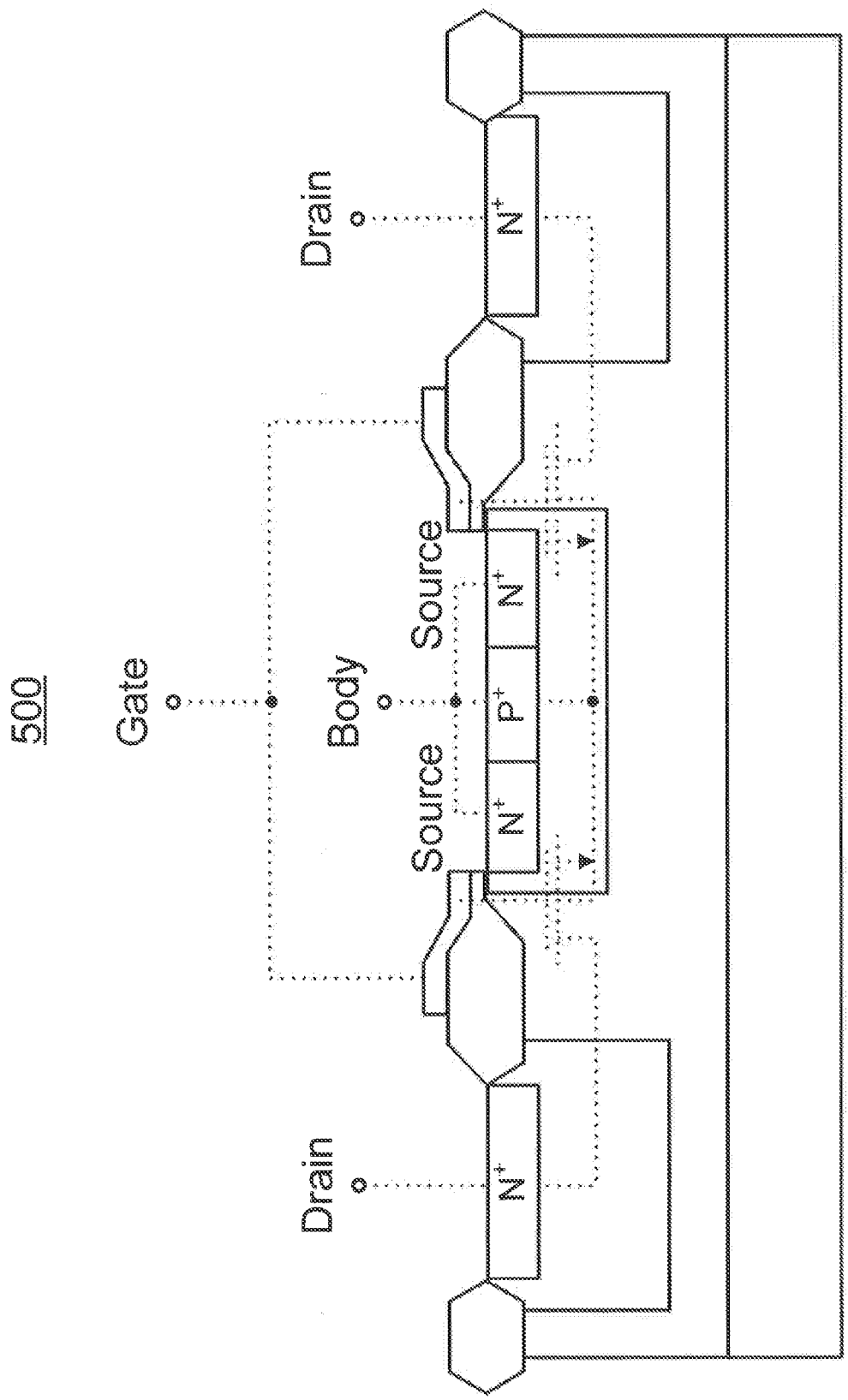

Compared to a conventional device (such as a conventional ESD protection device 500 shown in FIGS. 5A and 5B, where FIG. 5A is a plan view and FIG. 5B is a cross-sectional view taken along cut-line EE' in FIG. 5A), a device consistent with embodiments of the disclosure (hereinafter also referred to as a "novel ESD protection device"), such as the ESD protection device 200 shown in FIGS. 2 and 3A-3D or the ESD protection device 400 shown in FIGS. 4A-4C, has HV and LV MOS structures integrated in one device and has a built-in BJ structure in addition to MOS structures. In contrast the conventional ESD protection device 500 only has an HV MOS structure. As such, in a novel ESD protection device consistent with the disclosed embodiments, since the MOS structures and the BJ structure share portions of the same substrate area, the total substrate area required by the novel ESD protection device is nearly the same as by the conventional ESD protection device 500 having only an HV MOS structure. During the operation of the novel ESD protection device, the MOS structures and the BJ structure turn on at the same time, and thus ESD current passes through both the MOS structures and the BJ structure. During an ESD event, the ESD current can also flow through the deeper path of the BJ structure. Therefore, the novel ESD protection device has a lower turn-on resistance and an improved safe operating area (SOA). For example, compared to the conventional ESD protection device 500, the turn-on resistance of the novel ESD protection device can be reduced by about 13.2% to about 17.6%, and the SOA of the novel ESD protection device can be improved by about 10.3% to about 31.8%.

Comparisons between electrical characteristics of the conventional ESD protection device 500 and electrical characteristics of the ESD protection devices 200 and 400, are shown in FIGS. 6A, 6B, 7A, 7b, and 8.

Figure 6A:
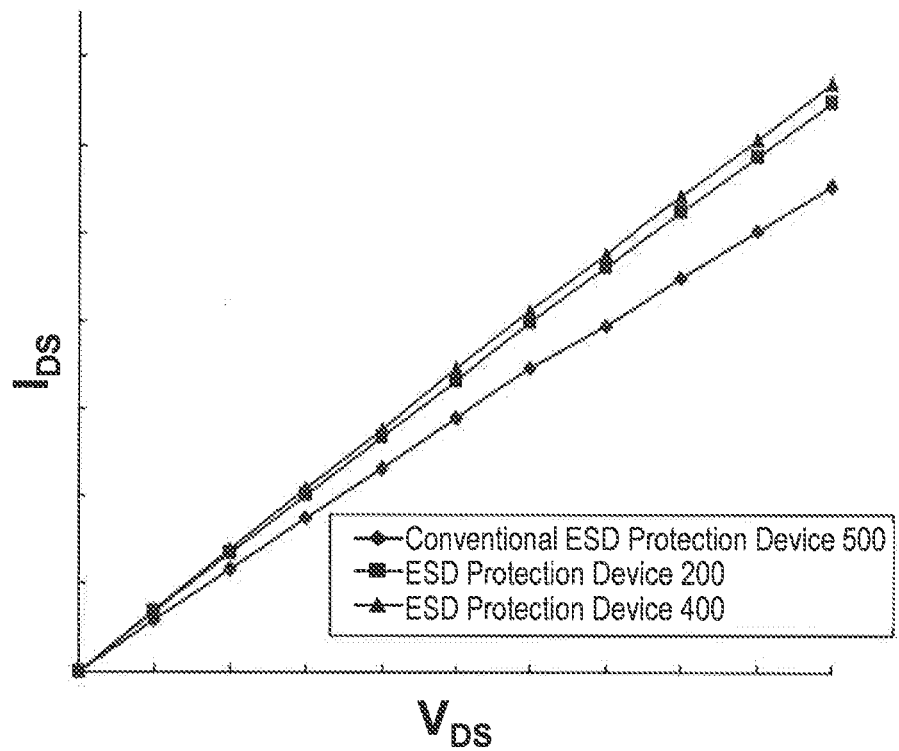
FIGS. 6A and 6B show measured current-voltage curves of a conventional ESD protection device and ESD protection devices consistent with embodiments of the disclosure.
Figure 6B:
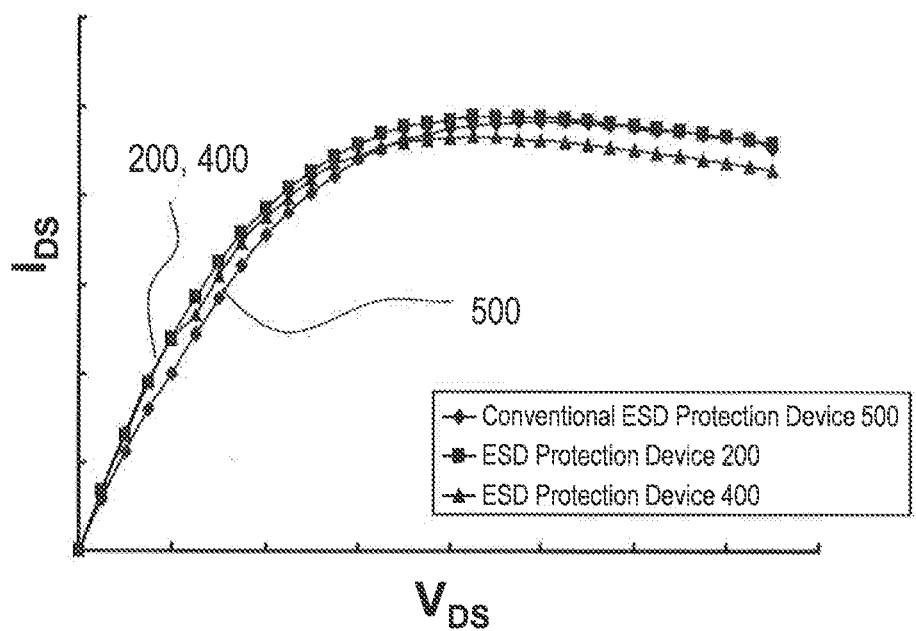

Specifically, FIGS. 6A and 6B show actually-measured $I_{DS}$-$V_{DS}$ curves (where "$I_{DS}$" refers to drain current and "$V_{DS}$" refers to drain voltage) of the conventional ESD protection device 500 and the ESD protection devices 200 and 400. FIG. 6A shows the linear regions of the $I_{DS}$-$V_{DS}$ curves, while FIG. 6B shows both the linear regions and the saturation regions of the $I_{DS}$-$V_{DS}$ curves. As seen from FIG. 6A, in the linear regions, at the same $V_{DS}$, the $I_{DS}$ of the ESD protection devices 200 and 400 is larger than the $I_{DS}$ of the conventional ESD protection device 500. Further, when $V_{DS}$ increases, the $I_{DS}$ of the ESD protection devices 200 and 400 increases faster as compared to the $I_{DS}$ of the conventional ESD protection device 500. This means that an on-state resistance, $R_{DS-on}$, of the ESD protection devices 200 and 400 is smaller than $R_{DS-on}$ of the conventional ESD protection device 500. Moreover, as seen in FIG. 6B, when the devices enter into the saturation region, the $I_{DS}$ of the ESD protection devices 200 and 400 is higher than the $I_{DS}$ of the conventional ESD protection device 500. That is, a saturation current, $I_{Ds-sat}$, of the ESD protection devices 200 and 400 is higher than $I_{DS-sat}$ of the conventional ESD protection device 500. In summary, as shown in FIGS. 6A and 6B, the ESD protection devices 200 and 400 can handle larger current when an ESD event occurs, as compared to the conventional ESD protection device 500.

Figure 7A:
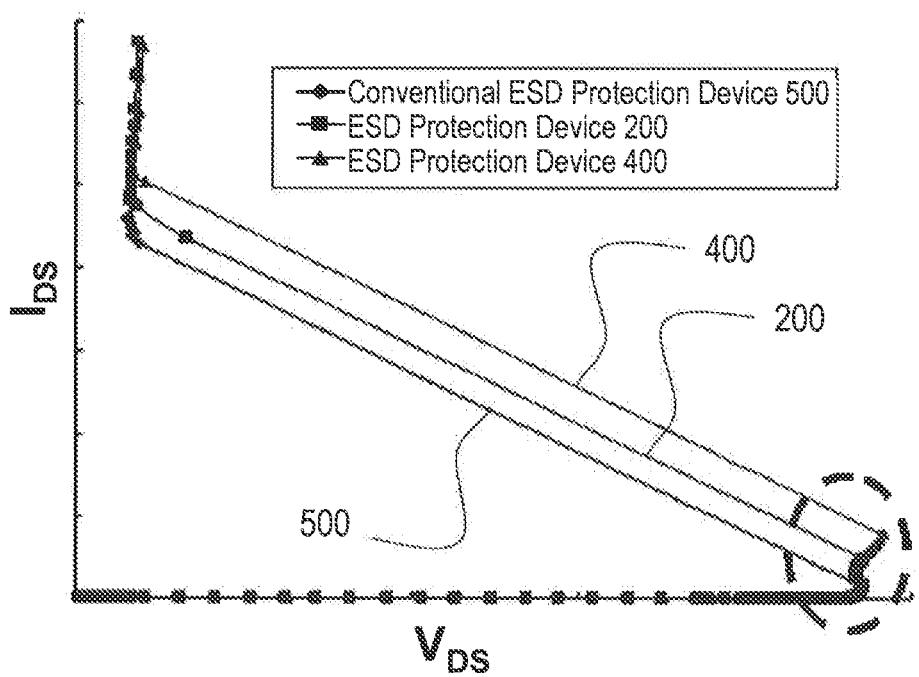
FIGS. 7A and 7B show measured transmission line pulse curves of the conventional ESD protection device and the ESD protection devices consistent with embodiments of the disclosure.
Figure 7B:
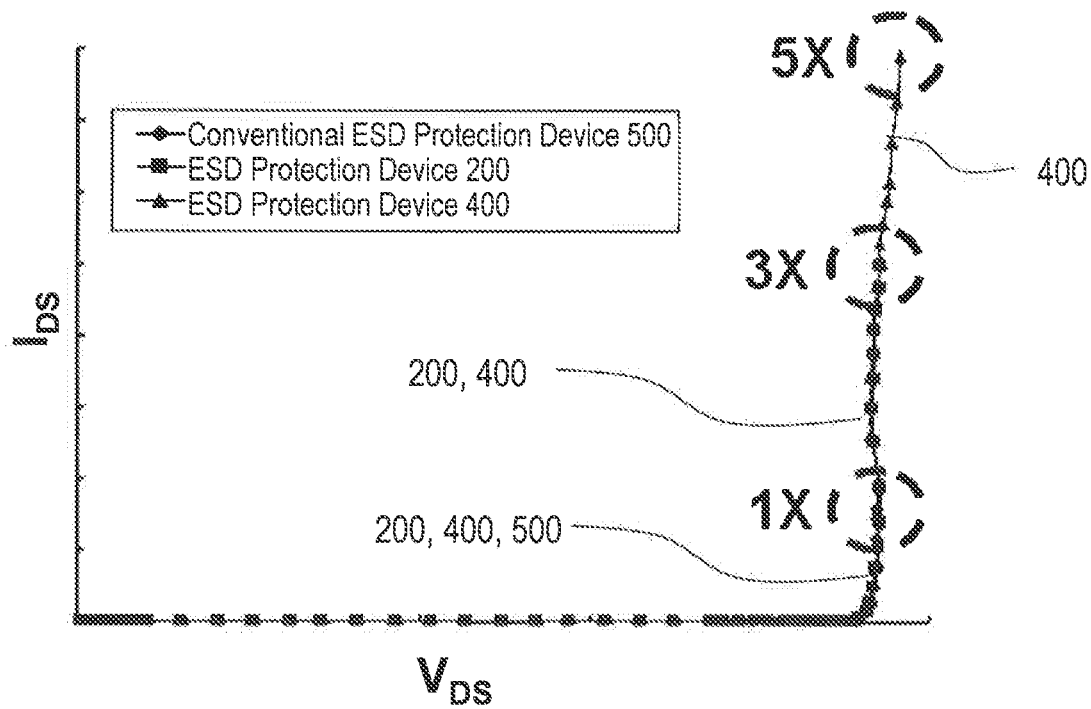

Transmission line pulse (TLP) testing was performed to evaluate the ESD protection performance of the ESD protection devices 200 and 400, and that of the conventional ESD protection device 500. FIG. 7A shows a TLP curve of the conventional ESD protection device 500 and TLP curves of the ESD protection devices 200 and 400. FIG. 7B is an enlarged view of the TLP curves, showing details of the portions where snapback occurs, i.e., where the devices are triggered to turn on (the circled region in FIG. 7A). In FIGS. 7A and 7B, the horizontal axis represents $V_{DS}$ and the vertical axis represents $I_{DS}$. As seen in FIGS. 7A and 7B, when snapback occurs, the $I_{DS}$ of each of the ESD protection devices 200 and 400 is higher than that of the conventional ESD protection device 500. That is, each of the ESD protection devices 200 and 400 has a higher trigger current than the conventional ESD protection device 500. Specifically, the trigger current of the ESD protection device 200 is about three times higher than the conventional ESD protection device 500, and that of the ESD protection device 400 is about five times higher than the conventional ESD protection device 500. In view of the higher trigger current, latch-up is less likely to occur in the ESD protection devices 200 and 400 as compared to the conventional ESD protection device 500.

Figure 8:
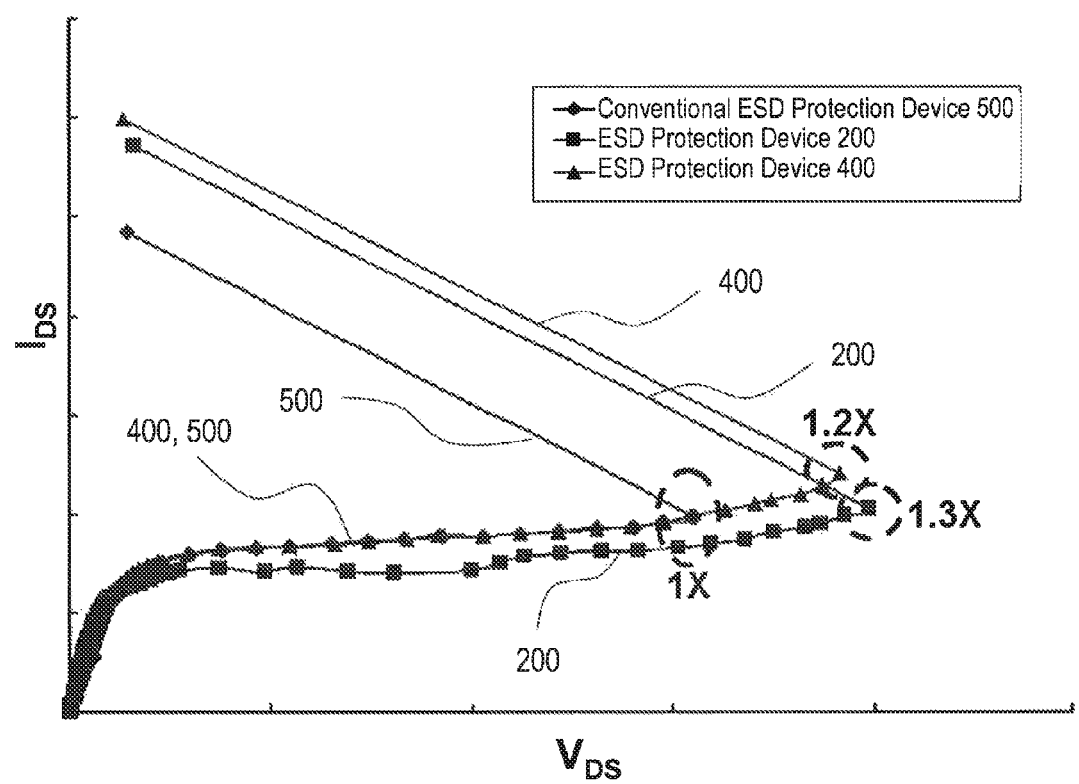
FIG. 8 shows measured electrical safe-operating area curves of the conventional ESD protection device and the ESD protection devices consistent with embodiments of the disclosure.

FIG. 8 shows the electrical safe-operating area (ESOA) measurement results for the conventional ESD protection device 500 and the ESD protection devices 200 and 400. The ESOA of a device determines a current-voltage boundary in which the device can safely switch, that is, the device may burn out, i.e., be damaged, if a $V_{DS}$ applied to the device exceeds the ESOA. Therefore, a device having a larger ESOA can operate safely at a higher applied voltage. Usually, the ESOA of a device can be measured in a manner similar to the TLP test but with a fixed voltage applied to a gate of the device (such as a zero voltage applied to the gate). As shown in FIG. 8, each of the ESD protection devices 200 and 400 has a larger ESOA than the conventional ESD protection device 500. Specifically, the ESOA of the ESD protection device 200 is about 1.3 times of the ESOA of the conventional ESD protection device 500, and the ESOA of the ESD protection device 400 is about 1.2 times of the ESOA of the conventional ESD protection device 500.

Table I below summarizes the improvements of the ESD protection devices 200 and 400 over the conventional ESD protection device 500. A percentage in the table means a change by that percentage, while "times" means how many times a certain property of one of the ESD protection device 200 and 400 is that property of the conventional ESD protection device 500. For example, as shown in Table I, the trigger current of the ESD protection device 200 is about three times the trigger current of the conventional ESD protection device 500. The improvements in $R_{DS-on}$, trigger current, and ESOA are also shown in FIGS. 6A-8. The ESD improvement refers to an improvement of the capability to provide ESD protection, i.e., an improvement of the capability to handle higher ESD voltage or larger ESD current. The ESD protection capability can be measured by simulating a discharge from a human body (human-body model, HBM), a machine (machine model, MM), or a charged device (charged-device model, CDM) or using an ESD gun.

TABLE I

Comparison between Conventional and Novel ESD Protection Devices

|  | ESD Protection Device 200 | ESD Protection Device 300 |
| --- | --- | --- |
| $R_{DS-on}$ Reduction | ~14.66% | ~17.59% |
| Trigger Current Improvement | ~3 times | ~5 times |
| ESOA Improvement | ~1.3 times | ~1.2 times |
| ESD Improvement | ~2.9 times | ~2.6 times |

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:
1. A semiconductor device comprising:
a substrate;
a first metal-on-semiconductor (MOS) structure formed in the substrate, the first MOS structure including:
 a first drain region, a first channel region, and a first source region arranged along a first direction in this order;
 a drain electrode formed over and conductively coupled to the first drain region; and
 a body region formed below and conductively coupled to the channel region;
a second MOS structure formed in the substrate, the second MOS structure including a second drain region, a second channel region, and a second source region arranged along a second direction different from the first direction in this order; and
a bipolar junction (BJ) structure formed in the substrate, the BJ structure including an emitter region, a base region, and a collector region,
wherein:
 the first source region and the second drain region share a first common semiconductor region in the substrate,
 the emitter region is in contact with the drain electrode,
 the drain electrode and the base region share a second common semiconductor region in the substrate, and
 the body region and the collector region share a third common semiconductor region in the substrate.

2. A semiconductor device comprising:
a substrate;
a high-voltage (HV) metal-on-semiconductor (MOS) structure formed in the substrate, the HV MOS structure including:
   a first semiconductor region having a first-type conductivity and a first doping level, the first semiconductor region being a drain region of the HV MOS structure;
   a second semiconductor region formed over the first semiconductor region, the second semiconductor region having the first-type conductivity and a second doping level higher than the first doping level, the second semiconductor region being a drain electrode of the HV MOS structure and conductively coupled to the drain region of the HV MOS structure;
   a third semiconductor region having a second-type conductivity, the third semiconductor region including a channel region of the HV MOS structure; and
   a fourth semiconductor region having the first-type conductivity, the fourth semiconductor region being a source region of the HV MOS structure,
   wherein:
      the first, third, and fourth semiconductor regions are arranged along a first direction in this order;
a low-voltage (LV) MOS structure formed in the substrate, the LV MOS structure including:
   a fifth semiconductor region having the second-type conductivity, the fifth semiconductor region being a channel region of the LV MOS structure; and
   a sixth semiconductor region having the first-type conductivity, the sixth semiconductor region being a source region of the LV MOS structure,
   wherein:
      the fourth semiconductor region is a drain region of the LV MOS structure, and
      the fourth, fifth, and sixth semiconductor regions are arranged along a second direction different from the first direction in this order; and
a bipolar junction (BJ) structure formed in the substrate, the BJ structure including:
   a seventh semiconductor region formed over the first semiconductor region and in contact with the second semiconductor region, the seventh semiconductor region having the second-type conductivity and being an emitter region of the BJ structure; and
   an eighth semiconductor region formed below the third semiconductor region and having the second-type conductivity, the eighth semiconductor region being a collector region of the BJ structure,
   wherein the second semiconductor region is a base region of the BJ structure,
wherein:
   the eighth semiconductor region is also a body region of the HV MOS structure, and
   the third and eighth semiconductor regions are parts of a continuous well having the second-type conductivity.

3. The semiconductor device according to claim 2, wherein the second direction is perpendicular to the first direction.

4. The semiconductor device according to claim 2, wherein the seventh semiconductor region has a doping level higher than a doping level of the third semiconductor region.

5. The semiconductor device according to claim 2, further comprising:
an electrode region formed in the sixth semiconductor region and conductively coupled to the continuous well, wherein the electrode region:
   has the second-type conductivity and a doping level higher than a doping level of the continuous well, and
   is a body electrode of the HV and LV MOS structures and a collector electrode of the BJ structure.

6. The semiconductor device according to claim 2, wherein:
the HV MOS structure further includes:
   a first gate dielectric film formed over the third semiconductor region; and
   a first gate electrode formed over the first gate dielectric film, and the LV MOS structure further includes
   a second gate dielectric film formed over the fifth semiconductor region; and
   a second gate electrode formed over the second gate dielectric film.

7. The semiconductor device according to claim 6, wherein:
the first and second gate dielectric films are parts of a continuous insulation layer formed over the substrate, and
the first and second gate electrodes are parts of a continuous polysilicon layer formed over the insulation layer.

8. The semiconductor device according to claim 2, further comprising:
a drain contact formed over the first semiconductor region; and
a source contact formed over the sixth semiconductor region.

9. The semiconductor device according to claim 8, wherein no contact is formed over the fourth semiconductor region.

10. The semiconductor device according to claim 2, wherein the seventh semiconductor region is in contact with the first semiconductor region and is surrounded by the second semiconductor region in directions parallel to a surface of the semiconductor device.

11. The semiconductor device according to claim 2, wherein:
the first-type conductivity is an N-type conductivity, and
the second-type conductivity is a P-type conductivity.

12. The semiconductor device according to claim 11, wherein the substrate is a P-type substrate,
the semiconductor device further comprising:
   an N-type well (N-Well) formed in the P-type substrate, the N-Well having a doping level lower than the first doping level,
   wherein the HV MOS structure, the LV MOS structure, and the BJ structure are formed in the N-Well.

13. The semiconductor device according to claim 12, wherein the N-Well includes a drift region of the HV MOS structure, the drift region being formed between the first and third semiconductor regions.

14. The semiconductor device according to claim 12, wherein the doping level of the N-Well is about $1\times10^{10}$ cm$^{-3}$ to about $1\times10^{16}$ cm$^{-3}$.

15. The semiconductor device according to claim 11, wherein the first semiconductor region includes a first N-type well (N-Well), the semiconductor device further comprising:
a second N-Well formed in the first N-Well, the second N-Well having a doping level higher than the first doping level and lower than the second doping level, wherein the second and fifth semiconductor regions are formed in the second N-Well.

16. The semiconductor device according to claim 2, wherein:
  the HV MOS structure is a first HV MOS structure, and the BJ structure is a first BJ structure,
  the HV MOS structure further including:
    a second HV MOS structure formed in the substrate, the second HV MOS structure including:
      a ninth semiconductor region having the second-type conductivity and being a channel region of the second HV MOS structure, the third and ninth semiconductor regions being arranged symmetrical to each other with respect to the fourth semiconductor region;
      a tenth semiconductor region having the first-type conductivity and being a drain electrode of the second HV MOS structure, the second and tenth semiconductor regions being arranged symmetrical to each other with respect to the fourth semiconductor region; and
      an eleventh semiconductor region having the first-type conductivity and being a second drain region of the second HV MOS structure, the first and eleventh semiconductor regions being arranged symmetrical to each other with respect to the fourth semiconductor region,
    wherein the fourth semiconductor region is a source region of the second HV MOS structure; and
  a second BJ structure formed in the substrate, the second BJ structure including:
    a twelfth semiconductor region formed over the eleventh semiconductor region and in contact with the tenth semiconductor region, and arranged approximately symmetrical to the seventh semiconductor region with respect to the fourth semiconductor region, the twelfth semiconductor region having the second-type conductivity and being an emitter region of the second BJ structure; and
    a thirteenth semiconductor region formed below the ninth semiconductor region and having the second-type conductivity, the thirteenth semiconductor region being a collector region of the second BJ structure,
    wherein the tenth semiconductor region is a base region of the second BJ structure,
  wherein:
    the thirteenth semiconductor region is also a body region of the second HV MOS structure, and
    the ninth and thirteenth semiconductor regions are parts of the continuous well portion.

17. The semiconductor device according to claim 16, wherein:
  the first HV MOS structure further includes a first drift region formed in the substrate and between the first and third semiconductor regions, the first drift region having the first-type conductivity and a doping level lower than the first doping level, and
  the second HV MOS structure further includes a second drift region formed in the substrate and between the eleventh and thirteenth semiconductor regions, the second drift region having the first-type conductivity and a doping level lower than a doping level of the eleventh semiconductor region.

18. The semiconductor device according to claim 17, wherein the first and second drift regions are parts of a continuous well having the first-type conductivity and formed in the substrate.

19. The semiconductor device according to claim 16, wherein:
  the tenth semiconductor region has a doping level approximately equaling the second doping level, and
  the eleventh semiconductor region has a doping level approximately equaling the first doping level.

20. A semiconductor device comprising:
  a substrate;
  a first well formed in the substrate, the first well having a first-type conductivity and a first doping level;
  a first heavily-doped region formed in the first well, the first heavily-doped region having the first-type conductivity and a second doping level higher than the first doping level;
  a second well formed in the substrate, the second well having a second-type conductivity and a third doping level;
  a second heavily-doped region formed in the second well, the second heavily-doped region having the first-type conductivity and a fourth doping level higher than the first doping level;
  a third heavily-doped region formed in the first well, the third heavily-doped region having the second-type conductivity and a fifth doping level higher than the third doping level, the third heavily-doped region being in contact with the first heavily-doped region;
  a fourth heavily-doped region formed in the second well, the fourth heavily-doped region having the first-type conductivity and a sixth doping level higher than the first doping level,
  wherein:
    the second well includes:
      a side portion formed between the first well and the second heavily-doped region; and
      an upper portion formed between the second and fourth heavily-doped regions,
    the first well, the side portion, and the second heavily-doped region are arranged along a first direction in this order, and
    the second heavily-doped region, the upper portion, and the fourth heavily-doped region are arranged along a second direction different from the first direction in this order.

* * * * *